United States Patent
Peng et al.

(10) Patent No.: US 7,760,846 B2
(45) Date of Patent: Jul. 20, 2010

(54) SHIFT REGISTER AND LIQUID CRYSTAL DISPLAY (LCD)

(75) Inventors: Hsin-Wei Peng, Taoyuan County (TW); Ming-Wei Huang, Taoyuan County (TW); Yi-Nan Chu, Changhua County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 66 days.

(21) Appl. No.: 12/356,541

(22) Filed: Jan. 21, 2009

(65) Prior Publication Data
US 2009/0213982 A1   Aug. 27, 2009

(30) Foreign Application Priority Data
Feb. 21, 2008   (TW) ............................. 97106098 A

(51) Int. Cl.
*G11C 19/00* (2006.01)
(52) U.S. Cl. ............................. 377/64; 377/68; 377/69; 377/78; 377/79
(58) Field of Classification Search ........................ None
See application file for complete search history.

(56) References Cited

U.S. PATENT DOCUMENTS

| 5,410,583 | A | 4/1995 | Weisbrod et al. |
| 6,339,631 | B1 * | 1/2002 | Yeo et al. ...................... 377/64 |
| 7,489,758 | B2 * | 2/2009 | Lan .............................. 377/64 |
| 2006/0139293 | A1 * | 6/2006 | Cho ........................... 345/100 |
| 2006/0146978 | A1 | 7/2006 | Jang |
| 2008/0062071 | A1 * | 3/2008 | Jeong ........................... 345/46 |

* cited by examiner

*Primary Examiner*—Tuan Lam
(74) *Attorney, Agent, or Firm*—Winston Hsu

(57) ABSTRACT

The present invention provides a shift register having simple circuit scheme capable of increasing lifetime of whole circuit and a related Liquid Crystal Display (LCD). The shift register includes a plurality of shift register units connected in cascade, wherein at least one of the plurality of shift register units includes: an output terminal, a first switch element, a second switch element, a third switch element, a fourth switch element, a fifth switch element, and a sixth switch element. In addition, The LCD includes a plurality of gate output signal lines and the shift register mentioned above. The plurality of shift register units connected in cascade are coupled to the plurality of gate output signal lines, respectively.

10 Claims, 7 Drawing Sheets

SHIFT REGISTER AND LIQUID CRYSTAL DISPLAY (LCD)

BACKGROUND OF THE INVENTION

1. Field of the Invention

The present invention relates to a shift register and a Liquid Crystal Display (LCD), and more particularly, to a shift register having simple circuit scheme capable of increasing lifetime of whole circuit and a related LCD.

2. Description of the Prior Art

Please refer to FIG. 1 and FIG. 2. FIG. 1 shows a circuit diagram of a shift register in the U.S. Pat. No. 5,410,583, and FIG. 2 shows a simplified timing diagram of each signal shown in FIG. 1. When the signal C3 is at high voltage level, the voltage source VDD will charge the node P2 so as to turn on the transistor 17 and the transistor 19 so as to perform a discharging operation on the output terminal and turn off the transistor 16. However, only when the input signal INPUT turned on the transistor 21, the voltage level of the node P2 is pulled to VSS, and the voltage level of the node P2 is maintained at high voltage level afterward. Thus, the duty of the node P2 is close to DC. In general, when the duty of the node P2 is closer to DC, the threshold voltage Vth of the TFT increases faster. When threshold voltage Vth increases too much, the circuit will be damaged.

Please refer to FIG. 3 and FIG. 4. FIG. 3 shows a circuit diagram of a shift register in the U.S. Patent publication No. 20060146978, and FIG. 4 shows a simplified timing diagram of each signal shown in FIG. 3. The U.S. Patent publication No. 20060146978 uses four group of clock signals and nine transistors T1, T2, T3, T4, T5, T6, T7, T8, and T9 to control the node Q and the node Qb, so as to let the voltage level of the node Qb has a periodical variation to solve the problem of the U.S. Pat. No. 5,410,583. However, the circuit diagram of the U.S. Patent publication No. 20060146978 is very complicated, and it is not easy to realize in practical, and it has risk of low yield.

SUMMARY OF THE INVENTION

It is therefore one of the objectives of the present invention to provide a shift register having simple circuit scheme capable of increasing lifetime of whole circuit and a related Liquid Crystal Display (LCD), so as to solve the above problem.

In accordance with an embodiment of the present invention, a shift register is disclosed. The shift register comprises a plurality of shift register units connected in cascade, wherein at least one of the plurality of shift register units comprises: an output terminal, a first switch element, a second switch element, a third switch element, a fourth switch element, a fifth switch element, and a sixth switch element. The first switch element comprises: a control terminal, coupled to a first clock signal; a first terminal, coupled to a first node; and a second terminal, coupled to an output terminal of a shift register unit at previous stage. The second switch element comprises: a control terminal, coupled to the first clock signal; a first terminal, coupled to a second node; and a second terminal, coupled to a first voltage source. The third switch element comprises: a control terminal, coupled to a second clock signal; a first terminal, coupled to a second voltage source; and a second terminal, coupled to the second node. The fourth switch element comprises: a control terminal, coupled to an output terminal of a shift register unit at next stage; a first terminal, coupled to the second voltage source; and a second terminal, coupled to the first node. The fifth switch element comprises: a control terminal, coupled to the first node; a first terminal, coupled to the output terminal; and a second terminal, coupled to a third clock signal. The sixth switch element comprises: a control terminal, coupled to the second node; a first terminal, coupled to the second voltage source; and a second terminal, coupled to the output terminal.

In accordance with an embodiment of the present invention, a LCD is further disclosed. The LCD comprises a plurality of gate output signal lines and a shift register. The shift register comprises a plurality of shift register units connected in cascade and respectively coupled to the plurality of gate output signal lines, wherein at least one of the plurality of shift register units comprises: an output terminal, a first switch element, a second switch element, a third switch element, a fourth switch element, a fifth switch element, and a sixth switch element. The output terminal is coupled to one of the plurality of gate output signal lines which is corresponding to the shift register. The first switch element comprises: a control terminal, coupled to a first clock signal; a first terminal, coupled to a first node; and a second terminal, coupled to an output terminal of a shift register unit at previous stage. The second switch element comprises: a control terminal, coupled to the first clock signal; a first terminal, coupled to a second node; and a second terminal, coupled to a first voltage source. The third switch element comprises: a control terminal, coupled to a second clock signal; a first terminal, coupled to a second voltage source; and a second terminal, coupled to the second node. The fourth switch element comprises: a control terminal, coupled to an output terminal of a shift register unit at next stage; a first terminal, coupled to the second voltage source; and a second terminal, coupled to the first node. The fifth switch element comprises: a control terminal, coupled to the first node; a first terminal, coupled to the output terminal; and a second terminal, coupled to a third clock signal. The sixth switch element comprises: a control terminal, coupled to the second node; a first terminal, coupled to the second voltage source; and a second terminal, coupled to the output terminal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and the claims to refer to particular system components. As one skilled in the art will appreciate, manufacturers may refer to a component by different names. This document does not intend to distinguish between components that differ in name but not function. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Figure 1:
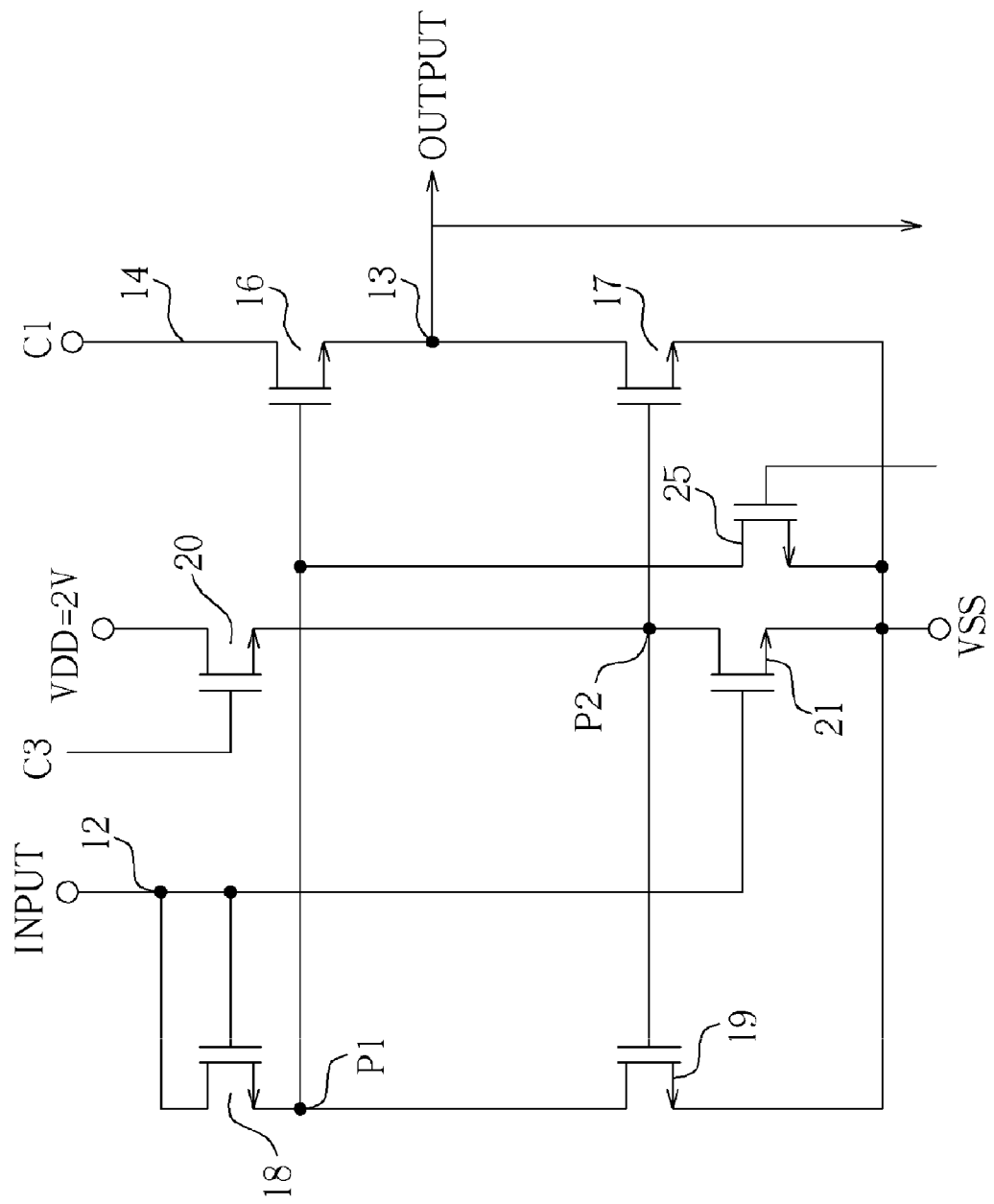
FIG. 1 shows a circuit diagram of a shift register in the U.S. Pat. No. 5,410,583.
Figure 2:
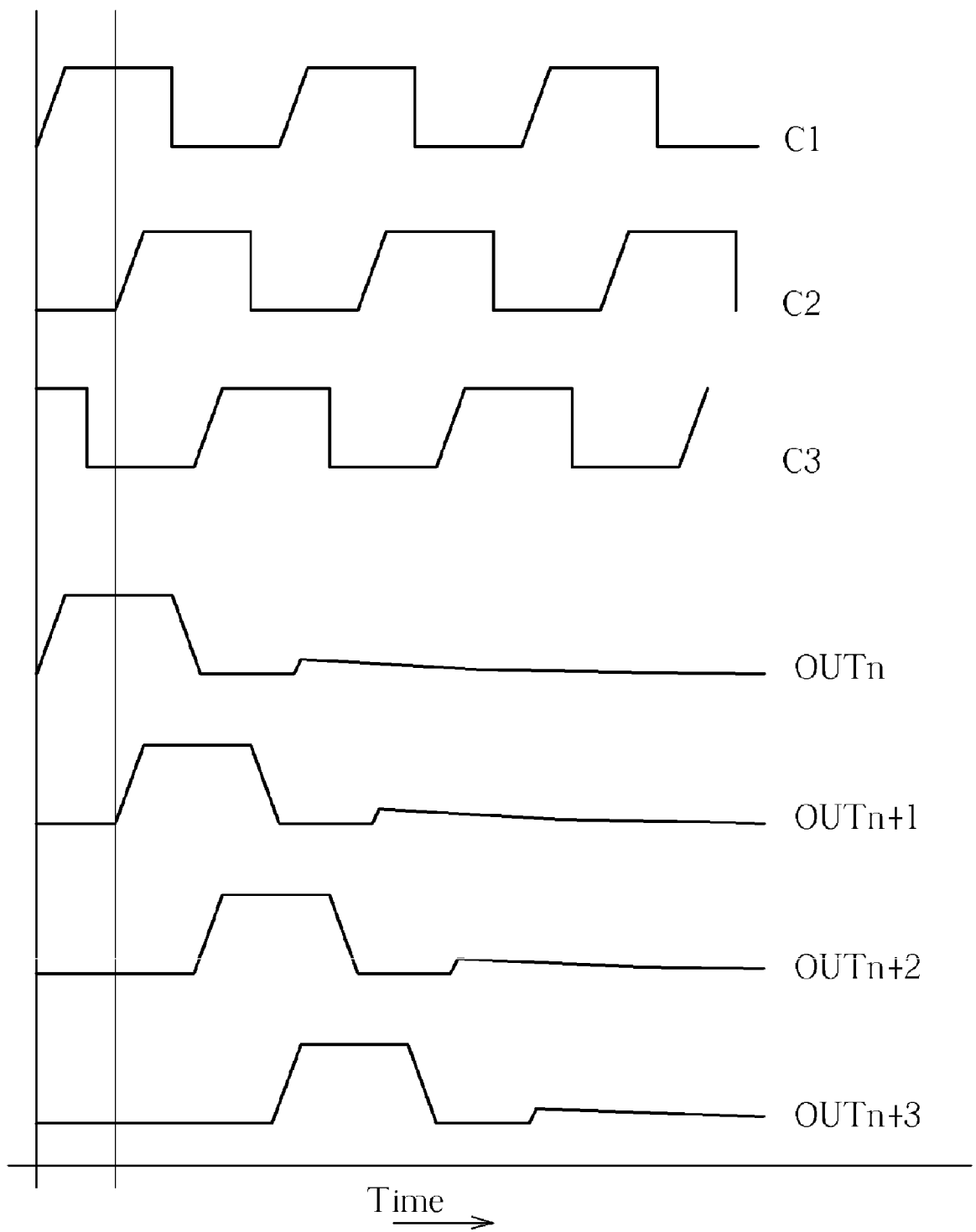
FIG. 2 shows a simplified timing diagram of each signal shown in FIG. 1.
Figure 3:
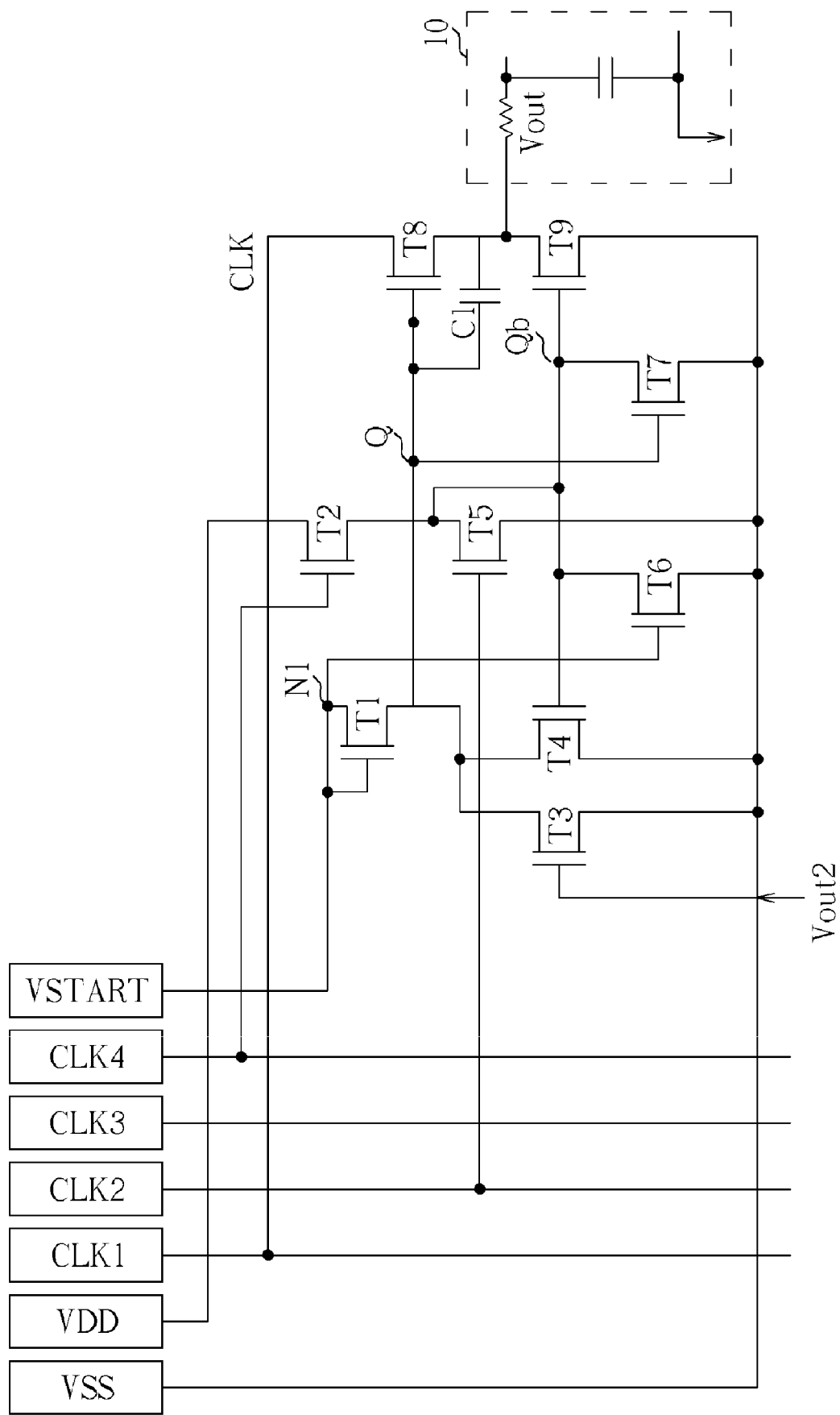
FIG. 3 shows a circuit diagram of a shift register in the U.S. Patent publication No. 20060146978.
Figure 4:
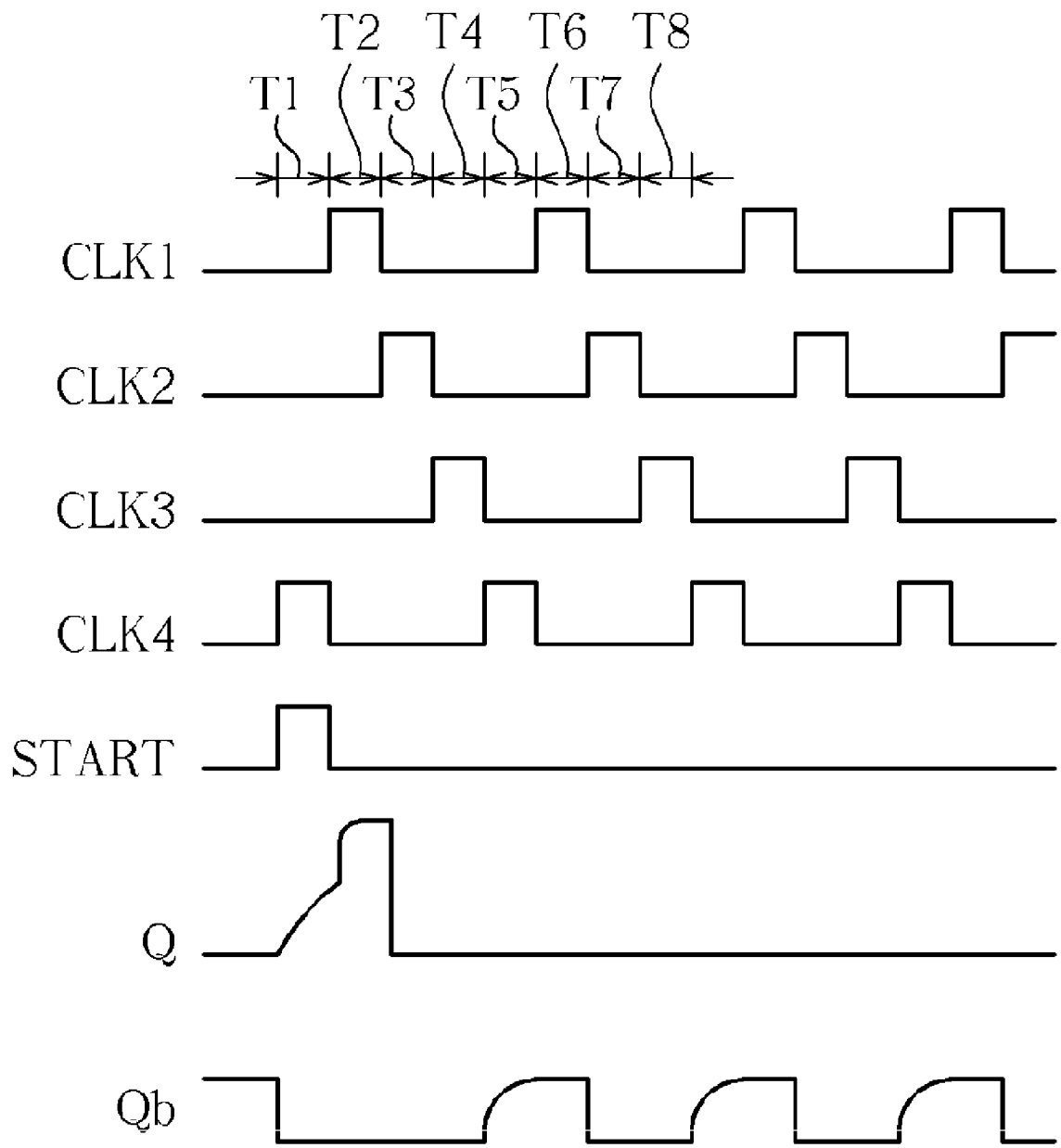
FIG. 4 shows a simplified timing diagram of each signal shown in FIG. 3.
Figure 5:
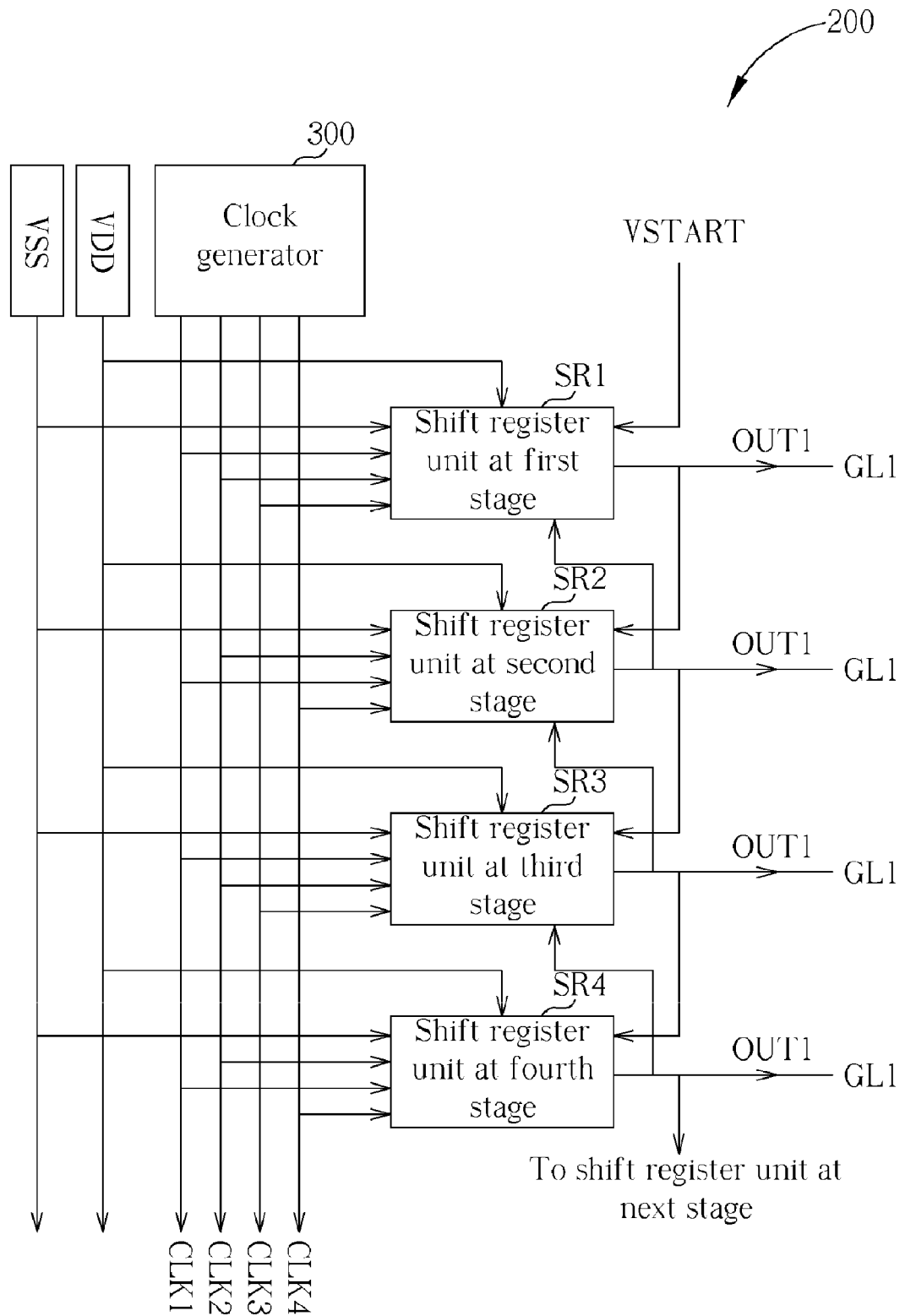
FIG. 5 shows a simplified block diagram of a shift register and a clock generator utilized in a Liquid Crystal Display (LCD) in accordance with an embodiment of the present invention.
Figure 6:
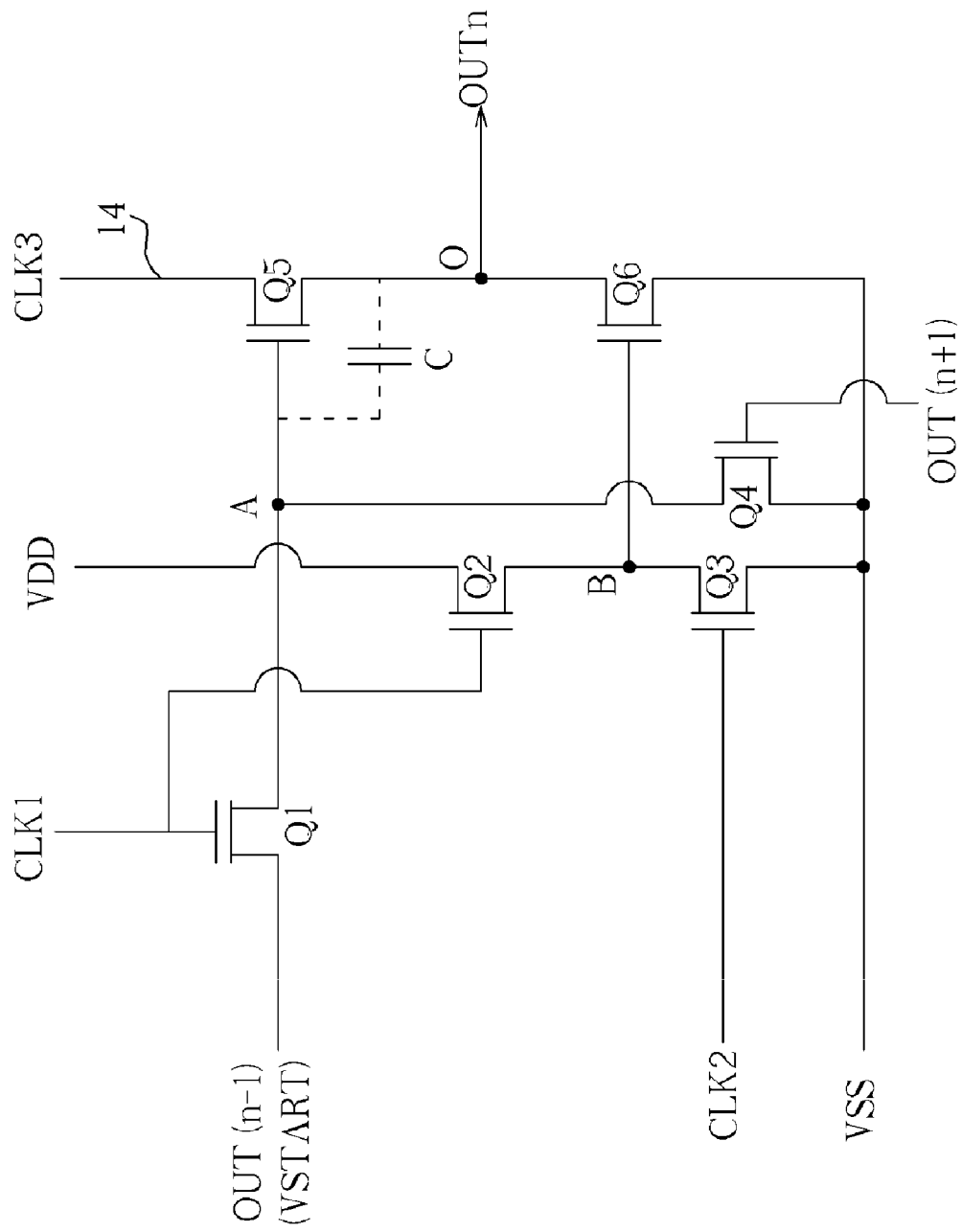
FIG. 6 shows a circuit diagram of a shift register unit SRn at nth stage of the shift register shown in FIG. 5.

Please refer to FIG. 5. FIG. 5 shows a simplified block diagram of a shift register 200 and a clock generator 300 utilized in a Liquid Crystal Display (LCD) (not shown) in accordance with an embodiment of the present invention, wherein the LCD comprises a plurality of gate output signal lines GL1, GL2, GL3, GL4, . . . , GLn−1, GLn, and the clock generator 300 is utilized for providing a first clock signal CLK1, a second clock signal CLK2, a third clock signal CLK3, a fourth clock signal CLK4. As shown in FIG. 5, the shift register 200 comprises a plurality of shift register units SR1, SR2, SR3, SR4, . . . , SRn−1, SRn connected in cascade and respectively coupled to the plurality of gate output signal lines GL1, GL2, GL3, GL4, . . . , GLn−1, GLn, and the clock generator 300. In addition, please refer to FIG. 6. FIG. 6 shows a circuit diagram of a shift register unit SRn at nth stage of the shift register 200 shown in FIG. 5. As shown in FIG. 6, the shift register unit SRn at nth stage comprises: an output terminal O, a capacitor C, a first switch element Q1, a second switch element Q2, a third switch element Q3, a fourth switch element Q4, a fifth switch element Q5, and a sixth switch element Q6. The output terminal O is coupled to gate output signal line GLn, and the capacitor C is coupled between the output terminal O and the first node A. In addition, in the circuit scheme of this embodiment, the first switch element Q1, the second switch element Q2, the third switch element Q3, the fourth switch element Q4, the fifth switch element Q5, and the sixth switch element Q6 all are N-type FETs (such as NMOSFETs). The first switch element Q1 comprises: a control terminal (i.e., a gate terminal), coupled to the first clock signal CLK1; a first terminal (i.e., a source terminal), coupled to a first node; and a second terminal (i.e., a drain terminal), coupled to an output signal OUT(n−1) (i.e., a start signal VSTART) of an output terminal O of a shift register unit at previous stage. The second switch element Q2 comprises: a control terminal (i.e., a gate terminal), coupled to the first clock signal CLK1; a first terminal (i.e., a source terminal), coupled to a second node B; and a second terminal (i.e., a drain terminal), coupled to a first voltage source VDD. The third switch element Q3 comprises: a control terminal (i.e., a gate terminal), coupled to a second clock signal CLK2; a first terminal (i.e., a source terminal), coupled to a second voltage source VSS; and a second terminal (i.e., a drain terminal), coupled to the second node B. The fourth switch element Q4 comprises: a control terminal (i.e., a gate terminal), coupled to an output signal OUT(n+1) of an output terminal O of a shift register unit at next stage (i.e., the shift register unit SR2); a first terminal (i.e., a source terminal), coupled to the second voltage source; and a second terminal (i.e., a drain terminal), coupled to the first node A. The fifth switch element Q5 comprises: a control terminal (i.e., a gate terminal), coupled to the first node A; a first terminal (i.e., a source terminal), coupled to the output terminal O; and a second terminal (i.e., a drain terminal), coupled to a third clock signal CLK3. The sixth switch element Q6 comprises: a control terminal (i.e., a gate terminal), coupled to the second node B; a first terminal (i.e., a source terminal), coupled to the second voltage source VSS; and a second terminal (i.e., a drain terminal), coupled to the output terminal O.

In addition, please note that the circuit schemes of the plurality of shift register units SR1, SR2, SR3, SR4, . . . , SRn−1 shown in FIG. 5 are all the same as the circuit scheme of the shift register unit SRn. The only difference between the shift register unit SR1 and the other shift register units SR2, SR3, SR4, . . . , SRn−1, SRn is that the second terminal (i.e., the drain terminal) of the individual first switch element Q1 of the shift register units SR2, SR3, SR4, . . . , SRn−1, SRn is respectively coupled to an output signal OUT(n−1) of an output terminal O of a shift register unit at previous stage regarded as a start signal VSTART, and the second terminal (i.e., the drain terminal) of the first switch element Q1 of the shift register unit SR1 is coupled to a start signal VSTART. Thus, further explanation of the details of the shift register units SR1, SR2, SR3, SR4, . . . , SRn−1 are omitted herein for the sake of brevity. In addition, in the shift register units at even number stages (such as the shift register units SR2, SR4, SR6, etc.), the control terminal (i.e., the gate terminal) of the third switch element Q3 is coupled to the fourth clock signal CLK4, and in the shift register units at odd number stages (such as the shift register units SR1, SR3, SR5, etc.), the control terminal (i.e., the gate terminal) of the third switch element Q3 is coupled to the second clock signal CLK2.

Figure 7:
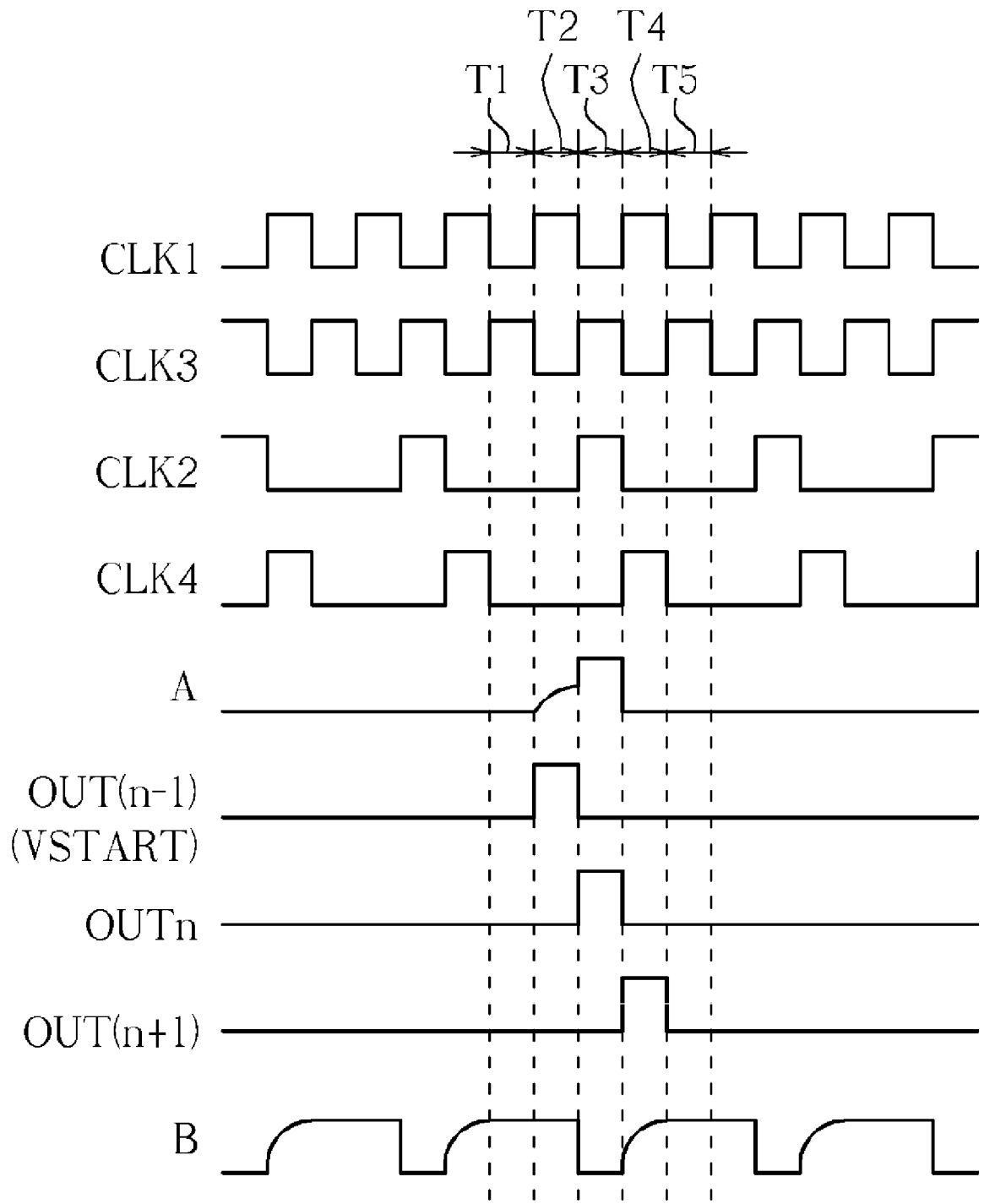
FIG. 7 shows a simplified timing diagram of the first clock signal CLK1, the second clock signal CLK2, the third clock signal CLK3, the fourth clock signal CLK4, the output signal OUT(n−1) (i.e., the start signal VSTART) of an output terminal of the shift register unit at previous stage, the output signal OUTn of the output terminal O, the output signal OUT(n+1) of an output terminal O of the shift register unit at next stage, the voltage level of the first node A, and the voltage level of the second node B shown in FIG. 5 and FIG. 6.

Please refer to FIG. 7. FIG. 7 shows a simplified timing diagram of the first clock signal CLK1, the second clock signal CLK2, the third clock signal CLK3, the fourth clock signal CLK4, the output signal OUT(n−1) (i.e., the start signal VSTART) of an output terminal of the shift register unit at previous stage, the output signal OUTn of the output terminal O, the output signal OUT(n+1) of an output terminal O of the shift register unit at next stage, the voltage level of the first node A, and the voltage level of the second node B shown in FIG. 5 and FIG. 6. As shown in FIG. 7, during the first time section T1, the start signal VSTART is at low voltage level, and all the first switch element Q1, the second switch element Q2, the third switch element Q3, the fourth switch element Q4, the fifth switch element Q5, and the sixth switch element Q6 are not turned on. The second node B maintains in the state of a previous time section (i.e., maintains at high voltage level), and there is no output at the output terminal O.

During the second time section T2, the start signal VSTART shifts to be at high voltage level, and the first clock signal CLK1 is at high voltage level and the third clock signal CLK3 is at low voltage level in the meantime. Thus, the first switch element Q1 and the second switch element Q2 are turned on, and the first node A will start to be charged, and the second node B is maintained to be at high voltage level.

During the third time section T3, the first node A is affected by the bootstrap effect of the capacitor C and will be charged to be at high voltage level, and thus the fifth switch element Q5 will be turned on, and the output terminal O will output the high voltage level of the third clock signal CLK3 (i.e., the output signal OUTn), so as to turn on the nth gate output signal line GLn and input the high voltage level of the third clock signal CLK3 to the second terminal (i.e., the drain terminal) of the first switch element Q1 in the shift register unit SR2 at next stage so as to use the high voltage level of the third clock signal CLK3 as the start signal VSTART of the shift register unit SR2 in the meantime. Meanwhile, the high voltage level of the second clock signal CLK2 will turn on the third switch element Q3 so as to pull the voltage level of the second node B to the voltage level of the second voltage source VSS (i.e., the low voltage level). Thus, at this time the sixth switch element Q6 will be turned off so as to ensure the output signal OUTn of the output terminal O to not be affected by the second voltage source VSS.

During the fourth time section T4, the first clock signal CLK1 is at high voltage level and thus the first switch element Q1 and the second switch element Q2 are turned on. At this time the start signal VSTART is not inputted, and the first voltage source VDD will charge the second node B so as to turn on the sixth switch element Q6. In the meantime, the output signal OUTn of the output terminal O will be pulled to the voltage level of the second voltage source VSS (i.e., the low voltage level), so as to turn off the first gate output signal line GL1, and the output signal OUT(n+1) at next stage will turn on the fourth switch element Q4 to pull the voltage level of the first node A to the voltage level of the second voltage source VSS (i.e., the low voltage level), so as to turn off the fifth switch element Q5.

During the fifth time section T5, the first clock signal CLK1 and the second clock signal CLK2 are at low voltage level, and thus all the first switch element Q1, the second switch element Q2, the third switch element Q3, the fourth switch element Q4, the fifth switch element Q5, and the sixth switch element Q6 are not turned on. The second node B is maintained to be at the state of the previous time section (i.e., at the high voltage level), and the output terminal O has no output at this time.

As mentioned above, the present invention can repeat the steps of the second time section T2, the third time section T3, the fourth time section T4, and the fifth time section T5 to perform a periodical charging and discharging operation to release accumulated voltage to slow down the bias curve of the threshold voltage of the TFT, so as to increase lifetime of the whole circuit.

Briefly summarized, the shift register utilized in the LCD disclosed by the present invention has simple circuit scheme and is capable of increasing lifetime of the whole circuit. Thus, the problems and disadvantages of the prior art can be solved.

Those skilled in the art will readily observe that numerous modifications and alterations of the device and method may be made while retaining the teachings of the invention.

What is claimed is:

1. A shift register, comprising:
   a plurality of shift register units connected in cascade, wherein at least one of the plurality of shift register units comprises:
   an output terminal;
   a first switch element, comprising:
      a control terminal, coupled to a first clock signal;
      a first terminal, coupled to a first node; and
      a second terminal, coupled to an output terminal of a shift register unit at previous stage;
   a second switch element, comprising:
      a control terminal, coupled to the first clock signal;
      a first terminal, coupled to a second node; and
      a second terminal, coupled to a first voltage source;
   a third switch element, comprising:
      a control terminal, coupled to a second clock signal;
      a first terminal, coupled to a second voltage source; and
      a second terminal, coupled to the second node;
   a fourth switch element, comprising:
      a control terminal, coupled to an output terminal of a shift register unit at next stage;
      a first terminal, coupled to the second voltage source; and
      a second terminal, coupled to the first node;
   a fifth switch element, comprising:
      a control terminal, coupled to the first node;
      a first terminal, coupled to the output terminal; and
      a second terminal, coupled to a third clock signal; and
   a sixth switch element, comprising:
      a control terminal, coupled to the second node;
      a first terminal, coupled to the second voltage source; and
      a second terminal, coupled to the output terminal.

2. The shift register of claim 1, further comprising:
   a capacitor, coupled between the output terminal and the first node.

3. The shift register of claim 1, wherein the first switch element, the second switch element, the third switch element, the fourth switch element, the fifth switch element, and the sixth switch element all are transistors.

4. The shift register of claim 3, wherein the first switch element, the second switch element, the third switch element, the fourth switch element, the fifth switch element, and the sixth switch element all are N-type field effect transistors (FETs).

5. The shift register of claim 1, wherein the first clock signal is the inverse of the third clock signal, the second clock signal is synchronous with a specific clock signal of the first clock signal and the third clock signal, and a cycle of the second clock signal is twice as long as a cycle of the specific clock signal.

6. A Liquid Crystal Display (LCD), comprising:
   a plurality of gate output signal lines; and
   a shift register, comprising:
      a plurality of shift register units connected in cascade and respectively coupled to the plurality of gate output signal lines, wherein at least one of the plurality of shift register units comprises:
      an output terminal, coupled to one of the plurality of gate output signal lines which is corresponding to the shift register;
      a first switch element, comprising:
         a control terminal, coupled to a first clock signal;
         a first terminal, coupled to a first node; and
         a second terminal, coupled to an output terminal of a shift register unit at previous stage;
      a second switch element, comprising:
         a control terminal, coupled to the first clock signal;
         a first terminal, coupled to a second node; and
         a second terminal, coupled to a first voltage source;
      a third switch element, comprising:
         a control terminal, coupled to a second clock signal;
         a first terminal, coupled to a second voltage source; and
         a second terminal, coupled to the second node;
      a fourth switch element, comprising:
         a control terminal, coupled to an output terminal of a shift register unit at next stage;
         a first terminal, coupled to the second voltage source; and
         a second terminal, coupled to the first node;
      a fifth switch element, comprising:
         a control terminal, coupled to the first node;
         a first terminal, coupled to the output terminal; and
         a second terminal, coupled to a third clock signal; and
      a sixth switch element, comprising:
         a control terminal, coupled to the second node;
         a first terminal, coupled to the second voltage source; and
         a second terminal, coupled to the output terminal.

7. The LCD of claim 6, further comprising:
   a capacitor, coupled between the output terminal and the first node.

8. The LCD of claim 6, wherein the first switch element, the second switch element, the third switch element, the fourth switch element, the fifth switch element, and the sixth switch element all are transistors.

9. The LCD of claim 8, wherein the first switch element, the second switch element, the third switch element, the fourth switch element, the fifth switch element, and the sixth switch element all are N-type field effect transistors (FETs).

10. The LCD of claim 6, wherein the first clock signal is the inverse of the third clock signal, the second clock signal is synchronous with a specific clock signal of the first clock signal and the third clock signal, and a cycle of the second clock signal is twice as long as a cycle of the specific clock signal.

* * * * *